(12) United States Patent
Osanai et al.

(10) Patent No.: US 7,847,377 B2
(45) Date of Patent: Dec. 7, 2010

(54) SEMICONDUCTOR DEVICE INCLUDING SEMICONDUCTOR CHIP WITH TWO PAD ROWS

(76) Inventors: Fumiyuki Osanai, c/o Elpida Memory, Inc., 2-1, Yaesu 2-chome, Chuo-ku, Tokyo (JP); Mitsuaki Katagiri, c/o Elpida Memory, Inc., 2-1, Yaesu 2-chome, Chuo-ku, Tokyo (JP); Satoshi Isa, c/o Elpida Memory, Inc., 2-1, Yaesu 2-chome, Chuo-ku, Tokyo (JP)

( * ) Notice: Subject to any disclaimer, the term of this patent is extended or adjusted under 35 U.S.C. 154(b) by 407 days.

(21) Appl. No.: 11/528,688

(22) Filed: Sep. 28, 2006

(65) Prior Publication Data

US 2007/0075440 A1 Apr. 5, 2007

(30) Foreign Application Priority Data

Sep. 29, 2005 (JP) ............................ 2005-283166

(51) Int. Cl.
*H01L 27/07* (2006.01)
(52) U.S. Cl. ............... 257/673; 257/734; 257/666; 257/784; 257/E23.001
(58) Field of Classification Search ............... 257/459, 257/503, 734, 739, 741–776, 779, 784, 786, 257/E23.015, E23.02, E21.523, E21.59, 738, 257/E23.001
See application file for complete search history.

(56) References Cited

U.S. PATENT DOCUMENTS

| | | | |
|---|---|---|---|
| 7,268,304 B2 * | 9/2007 | Beroz et al. ................. | 174/261 |
| 2003/0168253 A1 * | 9/2003 | Khandros et al. ........... | 174/261 |
| 2005/0184391 A1 * | 8/2005 | Shimizu et al. ............. | 257/738 |
| 2005/0243529 A1 * | 11/2005 | Beroz et al. ................ | 361/772 |
| 2006/0270107 A1 * | 11/2006 | Morrison et al. ........... | 438/106 |

FOREIGN PATENT DOCUMENTS

| | | |
|---|---|---|
| JP | 05-251495 | 9/1993 |
| JP | 5-283606 A | 10/1993 |
| JP | 05-343634 | 12/1993 |
| JP | 6-177202 A | 6/1994 |
| JP | 09-107081 | 4/1997 |
| JP | 11-163032 A | 6/1999 |
| JP | 11-340438 | 12/1999 |

* cited by examiner

*Primary Examiner*—Howard Weiss
*Assistant Examiner*—Tifney L Skyles

(57) ABSTRACT

A semiconductor device includes a semiconductor chip having at a center area thereof first and second pad rows which include a plurality of first pads and a plurality of second pads, respectively. A package substrate is bonded to the semiconductor chip. The package substrate includes a substrate opening corresponding to a region including the first and second pad rows, first and second wiring positioned at opposite sides of the substrate opening, respectively, and a ball land disposed in the first wiring area. A bridge section is provided over the substrate opening to mutually connect the first and second wiring areas. The ball land is electrically connected to at least one of the second pads through the bridge section by a lead.

13 Claims, 15 Drawing Sheets

US 7,847,377 B2

SEMICONDUCTOR DEVICE INCLUDING SEMICONDUCTOR CHIP WITH TWO PAD ROWS

This application claims priority to prior application JP 2005-283166, the disclosure of which is incorporated herein by reference.

BACKGROUND OF THE INVENTION

The present invention relates to a semiconductor device and, more specifically, relates to the arrangement of semiconductor chip pads connected to package terminals and the connections between the arranged pads and the package terminals.

Recently, as the operation speed of semiconductor devices has been increased and large-scale integration has been promoted, the size of the packages of semiconductor devices has been decreased so as to reduce the overall size of the semiconductor devices. For example, a dynamic random access memory (DRAM) with a large memory capacity of one gigabit that can be mounted on a small package has been developed. The small package employs a surface mounted ball grid array (BGA) including solder balls disposed on a package substrate. The arrangement of the solder balls in the BGA is standardized. Thus, the arrangements of signal pads and VDD/VSS pads included in the chip have to correspond to the standardized arrangement of the solder balls in the BGA.

Various different types of VDD and VSS pads are provided in the DRAM chip in a manner such that they are separated from each other so that noise generated at circuit blocks in the VDD and VSS pads does not affect other VDD and VSS pads. For example, an external power source and ground (GND) for a word-line voltage generator circuit (VDDP/VSSP) and an external power source and GND for a sense amplifier circuit (VDDDSA/VSSSA) are separated since noise generated at a power source that requires a large current affects other types of power sources. However, in a package, various types of ball lands corresponding to various types of power sources do not exist, but only one type of ball land is provided and is aggregated in the package pathway into the same electrical potential. In other words, the various types of power sources (e.g., VDD/VSS, VDDP/VSSP, and VDDDSA/VSSSA) is collectively treated as one type of power source (i.e., VDD/VSS) in the package.

FIGS. 1 to 3 are schematic plan views illustrating the power source-to-GND connection of such a known DRAM chip and package. FIG. 1 illustrates an overall schematic view. FIG. 2 illustrates a detailed view of the area at the right edge. FIG. 3 illustrates a detailed view of the area at the left edge. The semiconductor device is a resin-sealed BGA constructed by stacking a package substrate 9 on a DRAM chip 1 with an elastomer interposed therebetween. The DRAM chip 1 and the package substrate 9 are bonded together with the elastomer. Solder balls are provided on the package substrate 9 as connection pins to provide connection with the outside.

A single row of a plurality of pads 2 is provided on the DRAM chip 1. The elastomer has an elastomer opening 3 corresponding to the area where the pads 2 are disposed on the DRAM chip 1. The package substrate 9 includes a TAB tape having a plurality of ball lands 5 and leads 6. The TAB tape has a tape opening 4 corresponding to the elastomer opening 3. The tips (also referred to as "TAB leads") of the leads 6 in the tape opening 4 are bonded to the pads 2. The TAB leads are connected to the pads 2 of the DRAM chip 1. Accordingly, the pads 2 are connected to the ball lands 5, where solder balls are provided, via the leads 6. The elastomer opening 3 and the tape opening 4 are filled with sealing resin.

A pair of a VDD pad and a VSS pad, which are disposed adjacent to each other, is provided for each different type of power supply on the DRAM chip 1 to reduce loop inductance. As the entire package, a plurality of different types of power sources and GNDs having the same electrical potential are disposed alternately. Since the pads are arranged in a single row, leads can be connected to either one of the opposing sides of the pad row. A power supply lead 6-1 from a VDD pad can be connected to a ball land 5-1 on the first side (hereinafter referred to as the "upper side") of the pad row. Similarly, a GND lead 6-2 from a VSS pad can be connected to a GND ball land 5-2 on the second side (hereinafter referred to as the "lower side") of the pad row. In this way, leads from the pads 2 can be connected to power supply and GND ball lands 5 in the vicinity of the respective pads 2.

In the area at the right edge of the DRAM chip 1, a power supply (VDD) ball land 5-1 is provided on the upper side and a GND (VSS) ball land 5-2 is provided on the lower side. In this area, a power supply lead 6-1 is lead out upwards, whereas a GND lead 6-2 is lead out downwards. As shown in the detailed diagram in FIG. 2, from right to left on the DRAM chip 1, an external power supply (VDDSA/VSSSA) pads for a sense amplifier circuit, an external power supply (VSSP/VDDP) pads for a word-line voltage generator circuit, an external power supply (VDD/VSS) pads for general use, and an external power supply (VSSI/VDDI) pads for an internal step-down circuit are provided.

VDD pads and VSS pads are disposed adjacent to each other in pairs. A power supply (VDD) ball land 5-1 on the upper side is connected to pads 2 via a power supply lead 6-1 by bonding the tips of the TAB leads of the power supply lead 6-1 to the pads 2. Similarly, a GND (VSS) ball land 5-2 on the lower side is connected to pads 2 via a GND lead 6-2 by bonding the tips of the TAB leads of the GND lead 6-2 to the pads 2.

On the other hand, at the left edge area illustrated in FIG. 3, power supply ball lands and GND ball lands that can be connected to the pads are not provided in the lower left area. Therefore, the route of a power supply lead 6-1 led out downwards becomes long, i.e., almost one-quarter of the perimeter of the package. If, instead, a GND lead is led out downwards, the GND lead will have to be connected to a GND ball land 5-2 near the right edge, and the route of the lead will be even longer, i.e., almost half the perimeter of the package.

Recently, chips having a large area have been developed in response to the significant increase in memory capacity. However, because of limitations imposed by mounting a DIMM, a reduction in the area where pads are disposed has been required, even for a large-area chip. Therefore, an arrangement in which a plurality of memory array blocks is disposed at the periphery whereas two rows of pads are provided in the central area of the chip is proposed. However, when the pads are arranged in two rows and the VDD and VSS pads are arranged in the same manner as the above-described arrangement, the direction to lead out the leads cannot be selected in the same manner as when pads are arranged in a single row. Leads can only be lead out to the upper side from center pads in the upper row, whereas leads can only be lead out to the lower side from center pads in the lower row. In other words, the direction of the leads be lead out cannot be freely selected. As a result, leads to be lead out from the VDD and the VSS pads disposed at left ends of the center pad rows will have to be routed along an extremely long path, such as half the perimeter of the package. Consequently, some of the leads may not be able to reach ball lands.

As shown in FIG. 4, among the pads disposed in an order of "VSS pad, VDD pad, VDD pad, and VSS pad" from the right end of the upper row, the leftmost VSS pad cannot be connected to a ball land. Similarly, among pads disposed in an order of "VSS pad, VDD pad, VDD pad, and VSS pad" from the left end of the lower row, the rightmost VSS pad cannot be connected to a ball land.

FIG. 5 illustrates a case in which plated leads is used. For DRAMs, multi-bit products are provided in series. For example, a four-bit (×4) product and an eight-bit (×8) product are provided as bonding options. In a 4× product, compared to a 8× product, the higher order four-bit pins, among data (DQ) pins, are no-connection (NC) pins. An NC ball land that is a no-connection (NC) pin is connected to the edge of the package substrate by a plated lead. Since the plated lead is lead out toward the edge of the package substrate, it bypasses other plated leads. Therefore, for a 4× product, the routes of the leads are complex and the total length of the leads is long.

In this way, for a large-scale integrated semiconductor device having two rows of center pads in a chip, problems such as the total length of the leads connecting the ball lands of the package and the pads of the chip increasing or problems such as not being able connect the ball lands and pads may occur. In particular, such a problem is likely to occur in power supply leads provided separately for various different types of power supplies. The positions of the pads for difference types of power supplies, such as an external power supply (VDDSA/VSSSA) for a sense amplifier circuit or an external power supply (VDDP/VSSP) for a work-line voltage generator circuit, must be arranged carefully such that the power supply does not act as a noise source affecting signal lines and such that the power supply can efficiently supply electrical power to the entire chip. As described above, there are problem in the wiring for a semiconductor device having various different types of power supplies in that the ball lands of the package and the pads of the chip cannot be connected at low resistance with short leads.

Patent documents describing power supply wiring and pad arrangement on a chip include the following:

Japanese Unexamined Patent Application Publication No. 11-340438;

Japanese Unexamined Patent Application Publication No. 09-107081;

Japanese Unexamined Patent Application Publication No. 05-343634; and

Japanese Unexamined Patent Application Publication No. 05-251495.

According to Japanese Unexamined Patent Application Publication No. 11-340438, the power supply is reinforced by providing power supply leads as a mesh in the chip. According to Japanese Unexamined Patent Application Publication No. 09-107081, two rows of center pads arranged in a checkered pattern include a plurality of power supply pads. According to Japanese Unexamined Patent Application Publication No. 05-343634, memory arrays are provided at the periphery and two rows of pads are provided in the center so as to facilitate bit switching. According to Japanese Unexamined Patent Application Publication No. 05-251495, two types of semiconductor devices include two rows of center pads having a symmetrical pin arrangement by a bonding option.

However, these documents do not discuss the problems in which the power supply-to-GND connection between the package and the chip may become complex or connection may not be established at all. Therefore, solutions for such problems are not provided in these documents.

As described above, in a large-scale integrated semiconductor device, it is desirable to provide two rows of pads in the center of the semiconductor chip. However, since the pads arranged in two rows are separated into the pads in the upper row and the pads in the lower row, the pads in each row can only use the wiring area of the package substrate on the same side of that row. For this reason, connections between the ball lands of the package and the pads of the chip become complex. Since various different types of power supplies are used inside the semiconductor device, pads for particular types of power supplies are collectively disposed at the end of the center pads so as to prevent noise from being generated between power supplies. As a result, the connections between the ball lands of the package and the pads of the chip become even more complex, and the total length of the leads become long, or connection cannot be established at all. Consequently, there is a problem in that the ball lands of the package and the pads of the chip cannot be connected at low resistance with short leads.

SUMMARY OF THE INVENTION

It is therefore an object of the present invention to provide a semiconductor device that operates stably by stably supplying a power supply voltage by connecting ball lands of a package and pads of a chip at low resistance with short leads.

Other objects of the present invention will become clear as the description proceeds.

According to an aspect of the present invention, there is provided a semiconductor device comprising a semiconductor chip having two pads rows in a center area of the semiconductor chip, the pad rows including at least one pair of a power supply pad and a GND pad at an end sections and a middle section of the pad rows.

According to another aspect of the present invention, there is provided a semiconductor device comprising a semiconductor chip having at a center area thereof first and second pad rows which include a plurality of first pads and a plurality of second pads, respectively, a package substrate bonded to the semiconductor chip, the package substrate including a substrate opening corresponding to a region including the first and second pad rows, first and second wiring positioned at opposite sides of the substrate opening, respectively, and a ball land disposed in the first wiring area, a bridge section provided over the substrate opening to mutually connect the first and second wiring areas, and a lead electrically connecting the ball land with at least one of the pads in the second pad row through the bridge section.

DESCRIPTION OF THE PREFERRED EMBODIMENTS

The present invention will be described below in detail with reference to the drawings.

First, with reference to FIG. 6, description will be made as regards a semiconductor chip having pads arranged in two rows included in a semiconductor device according to a first embodiment of the present invention.

A DRAM chip 1, which is a semiconductor chip, has memory array blocks 11 disposed along the periphery of the chip. In the center of the chip, a plurality of pads 2 is provided in a two-row arrangement. The DRAM chip 1 includes various different types of VDD pads and VSS pads. For example, the DRAM chip 1 includes external power supply (VDD/VSS) pads for a regular circuit, external power supply (VDDSA/VSSSA) pads for a sense amplifier circuit, external power supply (VDDP/VSSP) pads for word-line voltage generator circuit, and an external power supply (VDDI/VSSI) pads for an internal step-down circuit. Among these power supplies, the external power supply (VDDSA/VSSSA) pads for a sense amplifier circuit and the external power supply (VDDP/VSSP) pads for word-line voltage generator circuit particularly easily become sources of noise. Therefore, these pads are collectively disposed at both ends of the pads in the center.

A case in which the external power supply (VDDSA/VSSSA) pads for a sense amplifier circuit or the external power supply (VDDP/VSSP) pads for word-line voltage generator circuit are disposed at both ends of the two rows of pads disposed in the center will be discussed. Various arrangements of the pads are possible. As examples, various arrangements of the external power supply (VDDSA/VSSSA) pads for a sense amplifier circuit are illustrated in FIGS. 7A to 7E.

Figure 7A:
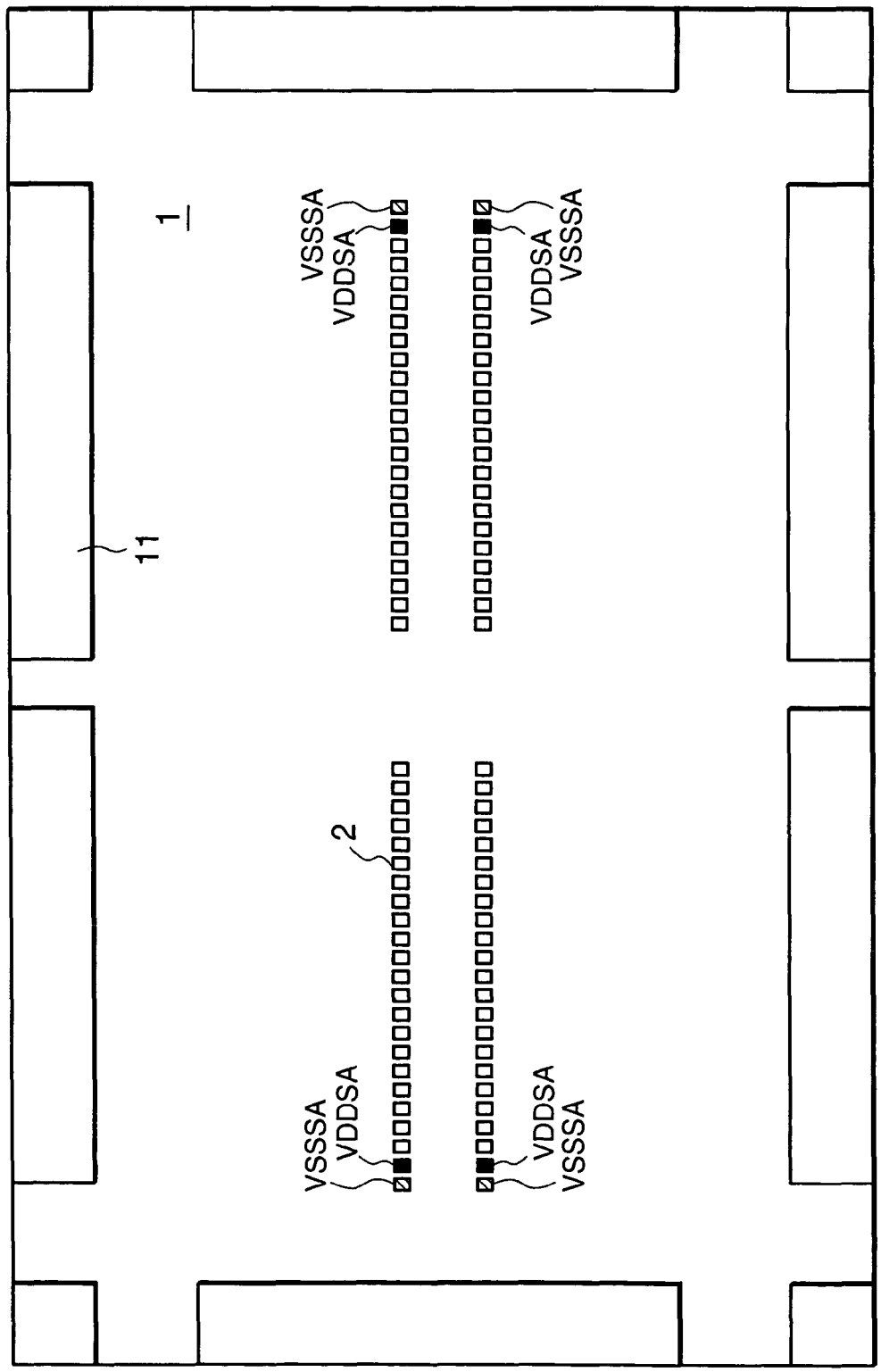
FIGS. 7A to 7E are enlarged views of the area delimited by a dotted line in FIG. 6 and illustrate different VDD and VSS pad arrangements.

In FIG. 7A, four pairs of external power supply (VDDSA/VSSSA) pads for a sense amplifier circuit are provided at the ends of the two pad rows. This arrangement enables efficient power supply to the entire large-area chip.

Figure 7B:
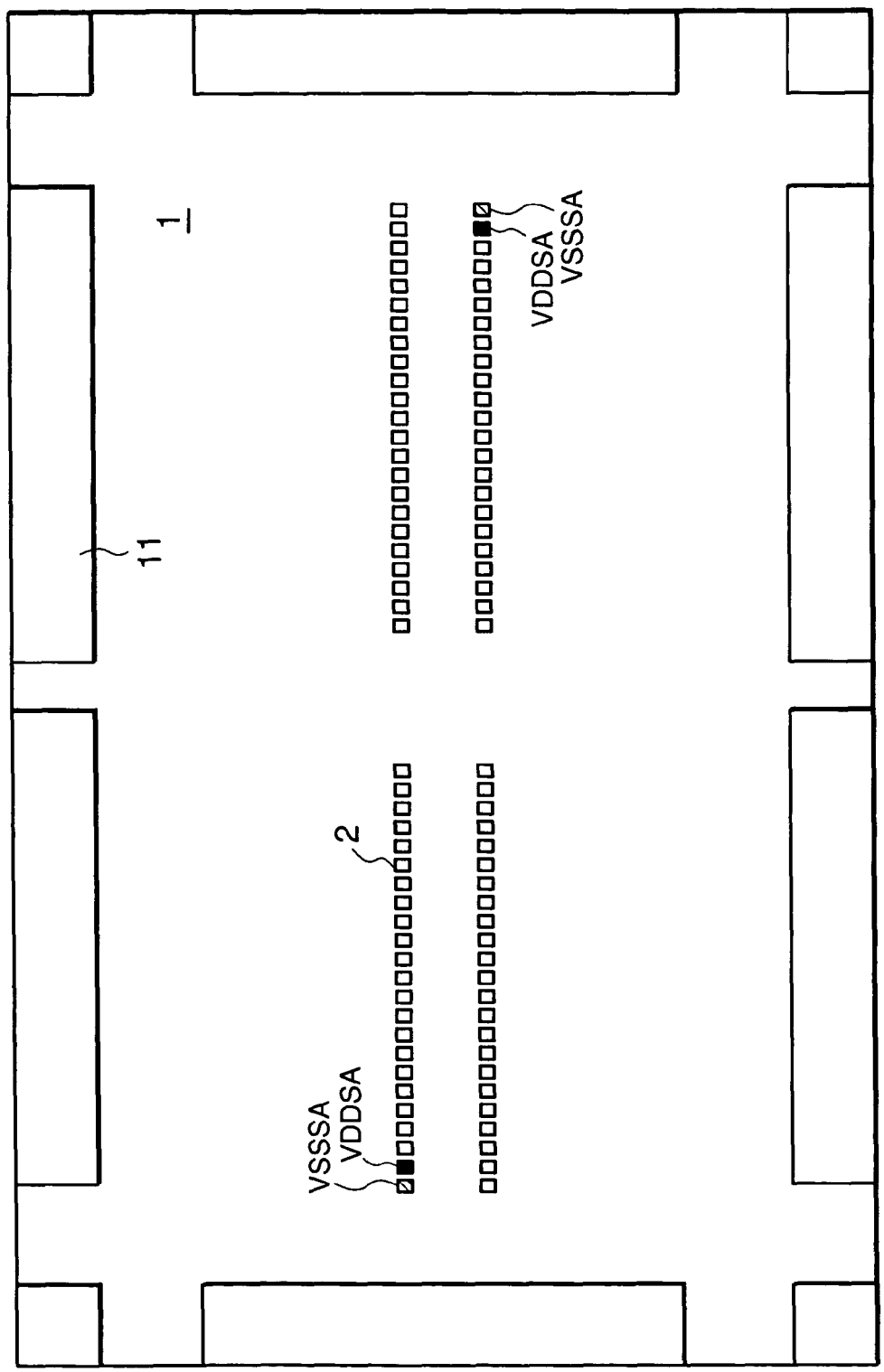
Figure 7C:
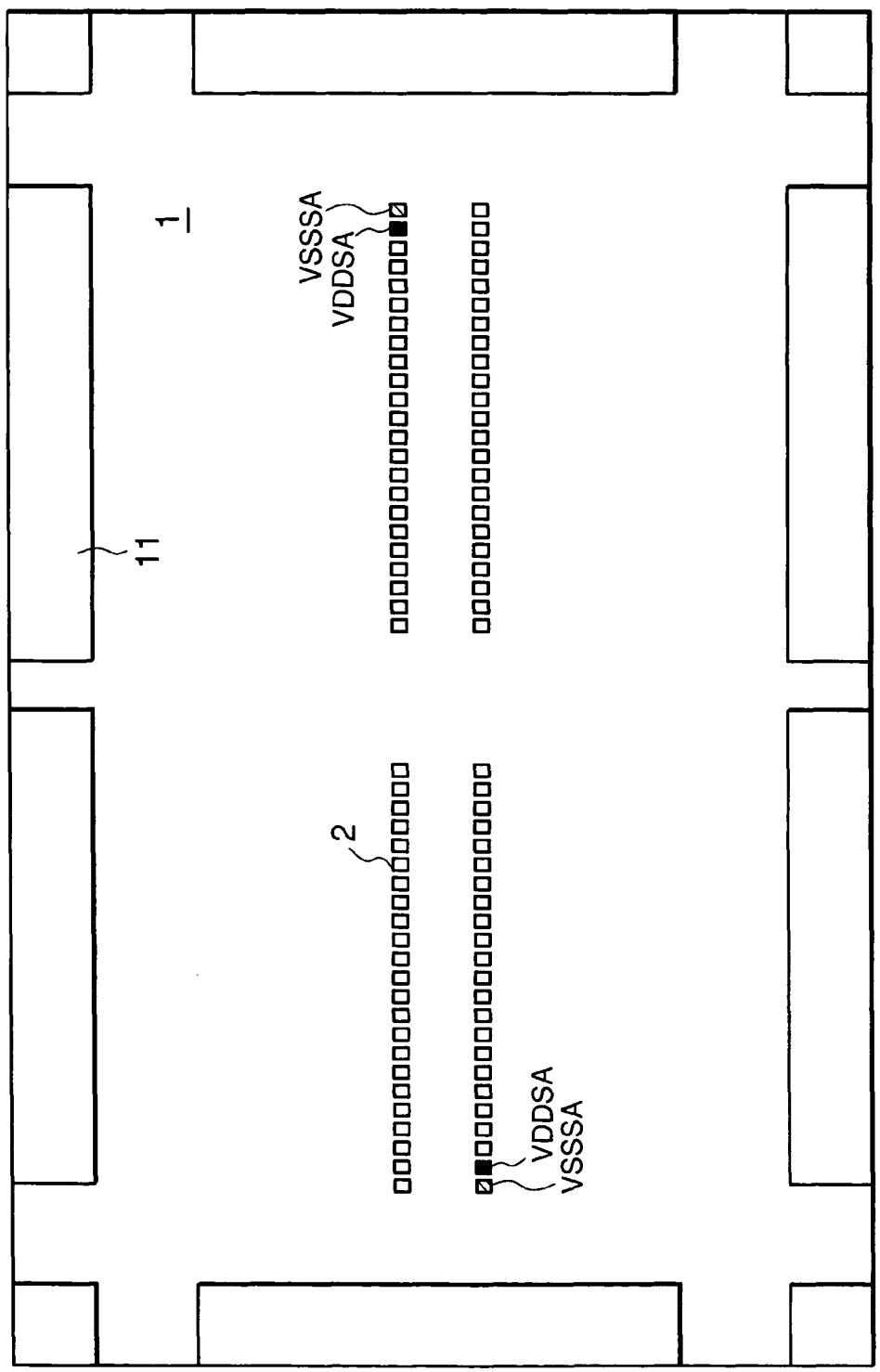
Figure 7D:
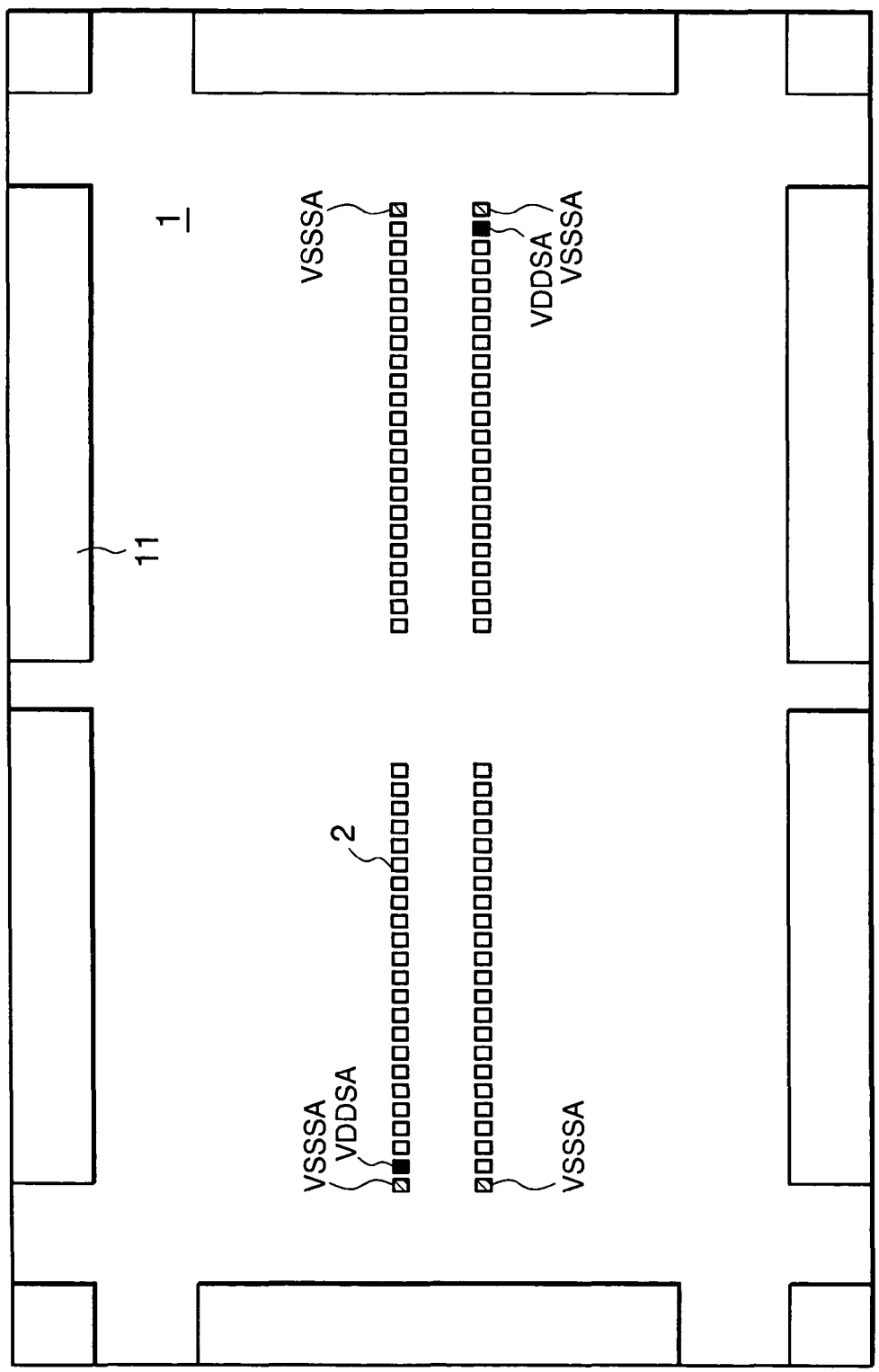
Figure 7E:
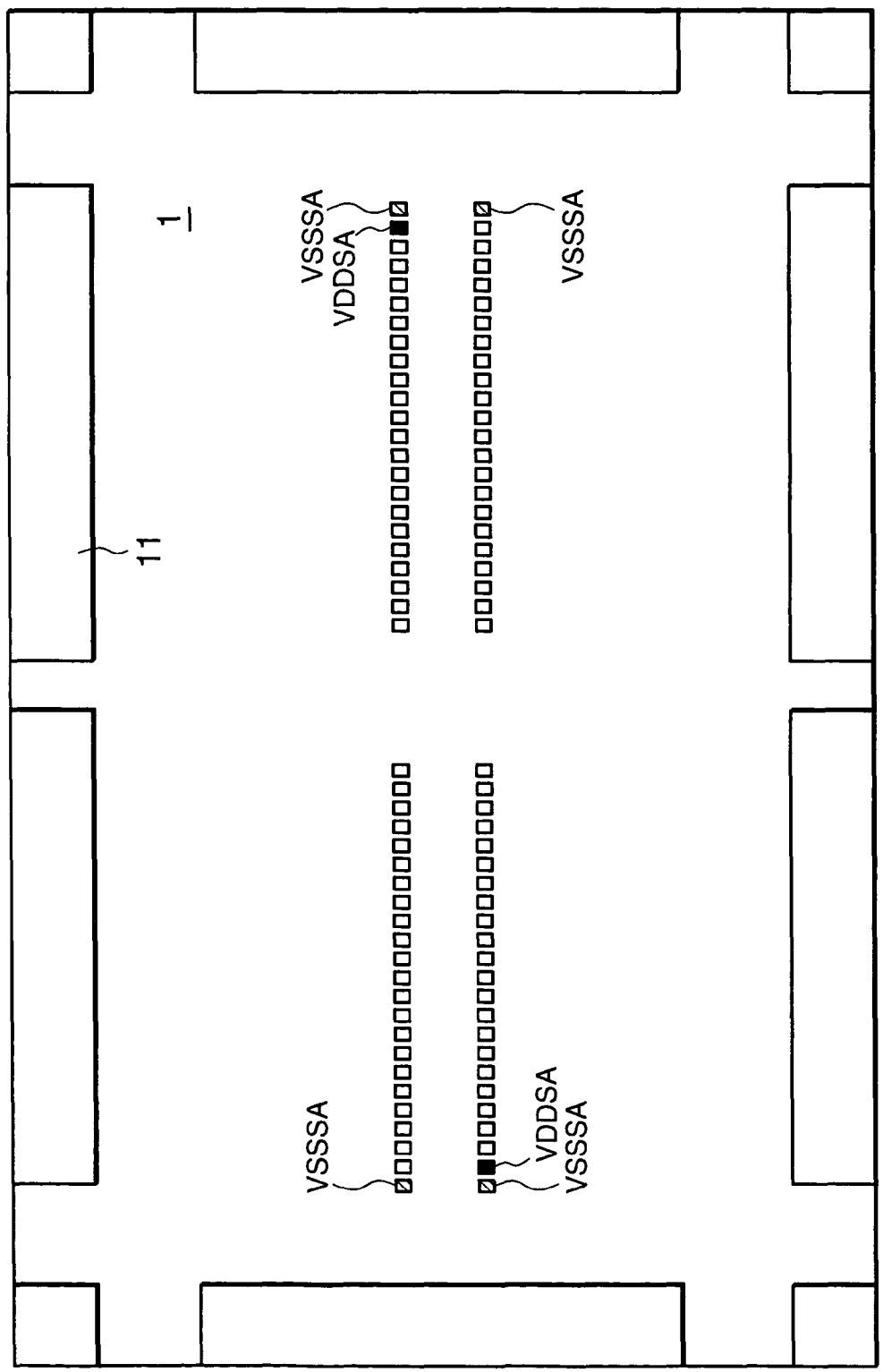

FIGS. 7B and 7C illustrate two pairs of external power supply (VDDSA/VSSSA) pads for a sense amplifier circuit. When two pairs are disposed, importance is placed on symmetry. Therefore, as shown in FIG. 7B, the pairs of VDDSA and VSSSA pads are disposed at the left end of the upper row and the right end of the lower row. Instead, as shown in FIG. 7C, the pairs of VDDSA and VSSSA pads may be disposed at the left end of the lower row and the right end of the upper row. FIGS. 7D and 7E illustrate cases in which three pairs of external power supply (VDDSA/VSSSA) pads for a sense amplifier circuit are provided. In these cases, the arrangements are based on those illustrated in FIGS. 7B and 7C. However, since the pairs of pads cannot be disposed symmetrically, one VSS pad (VSSSA) is provided at each end of the rows where pairs of pads are not disposed. In a case in which the arrangement is not symmetric, VSS pads are disposed with priority.

According to the pad arrangements illustrated in FIGS. 7A to 7E, the power supply (VDD) pads are disposed laterally adjacent to the GND (VSS) pads. However, the power supply (VDD) pads and the GND (VSS) pads may be disposed vertically adjacent to each other. In this way, even for one type of power supply pads, i.e., VDD and VSS pads, many arrangements are possible depending on how many pairs of VDD and VSS pads are to be provided.

The power supply-to-GND wire connection between various pads of the chip and ball lands of the package will be described below.

A DRAM chip 1 includes two rows of pads in the center area. At the ends of the pad rows in the center, at least two pairs of external power supply (VDDSA/VSSSA) pads for a sense amplifier circuit and external power supply (VDDP/VSSP) pad for word-line voltage generator circuit are disposed symmetrically. For other VDD and VSS pads, VDD pads are disposed in one of the two rows of pads, the VSS pads are disposed in the other row of pads, and the VDD and VSS pads for corresponding power supplies are disposed opposite to each other. In the drawings, in some cases, the VDD pads and VSS pads are indicated simply as "V" and "G," respectively.

Figure 8A:
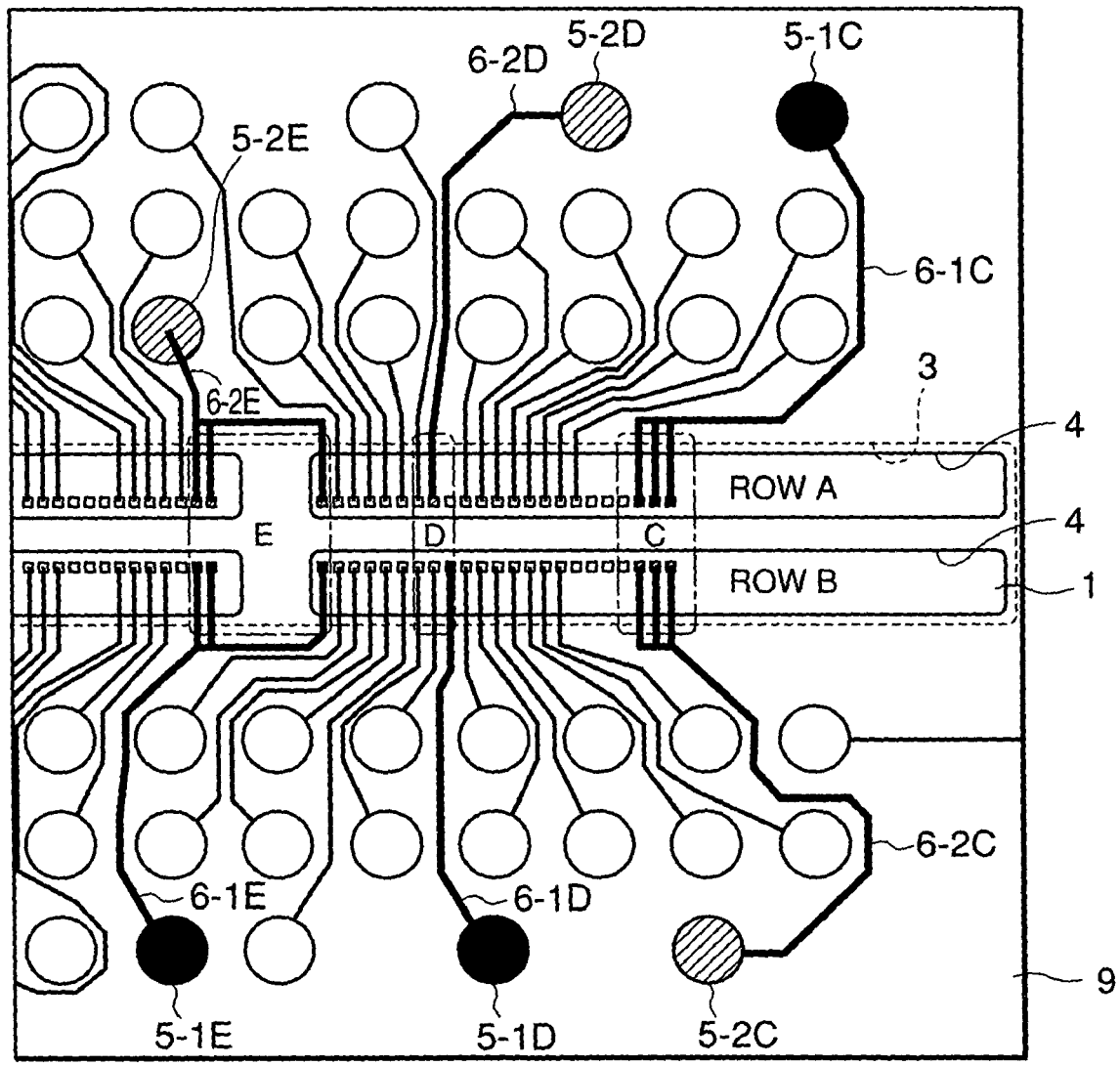
FIG. 8A is a power supply-to-GND connection diagram illustrating the connection between ball lands and pads in the right area of the semiconductor device according to the first embodiment of the present invention.
Figure 8B:
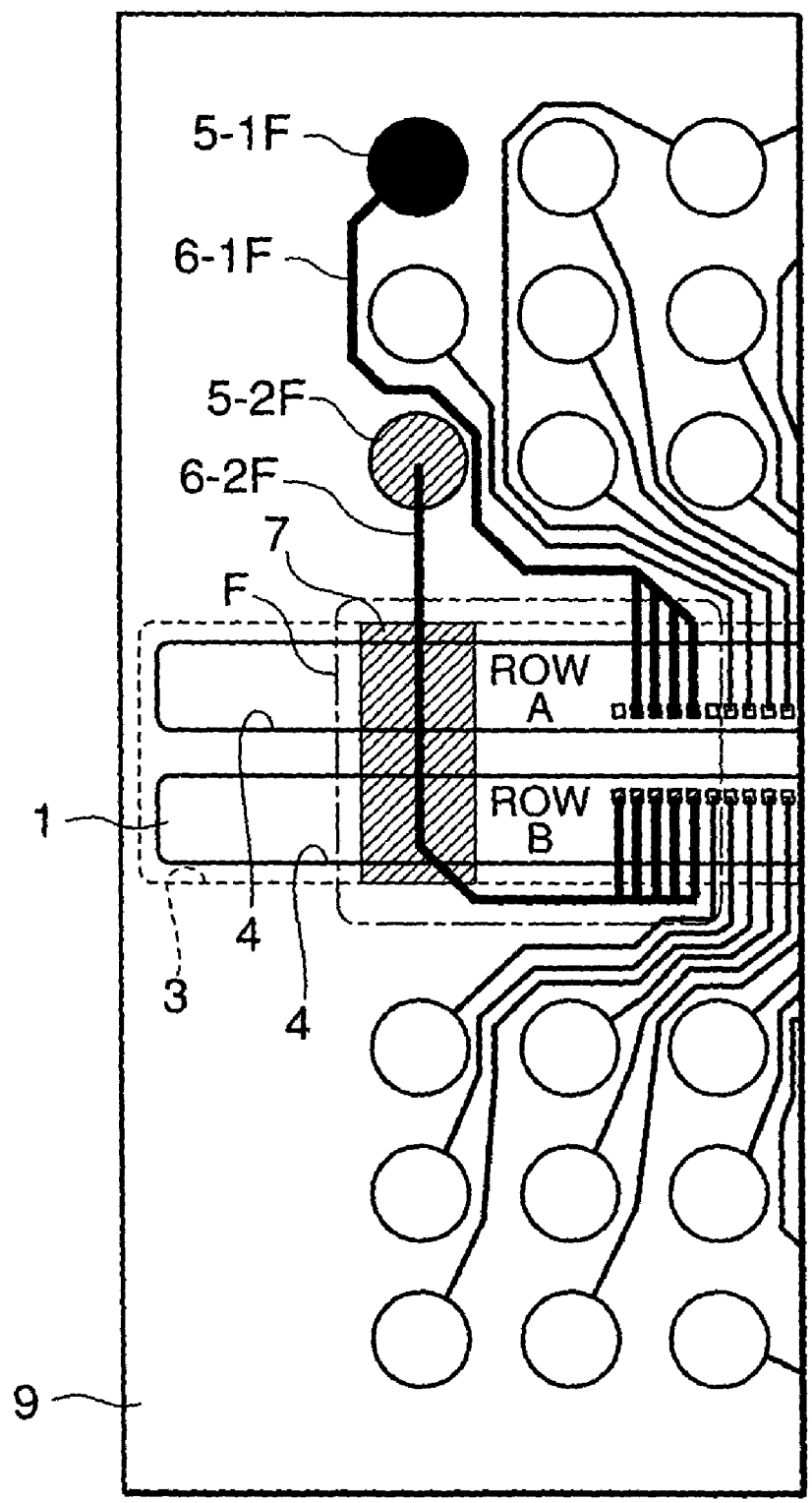
FIG. 8B is a power supply-to-GND connection diagram illustrating the connection between ball lands and pads in the left area of the semiconductor device shown in FIG. 8A.

With reference to FIGS. 8A and 8B, the description will be directed to the semiconductor device according to the first embodiment of the present invention. The components that are the same as those described above are represented by the same reference numerals, and descriptions thereof are not repeated.

Figure 1:
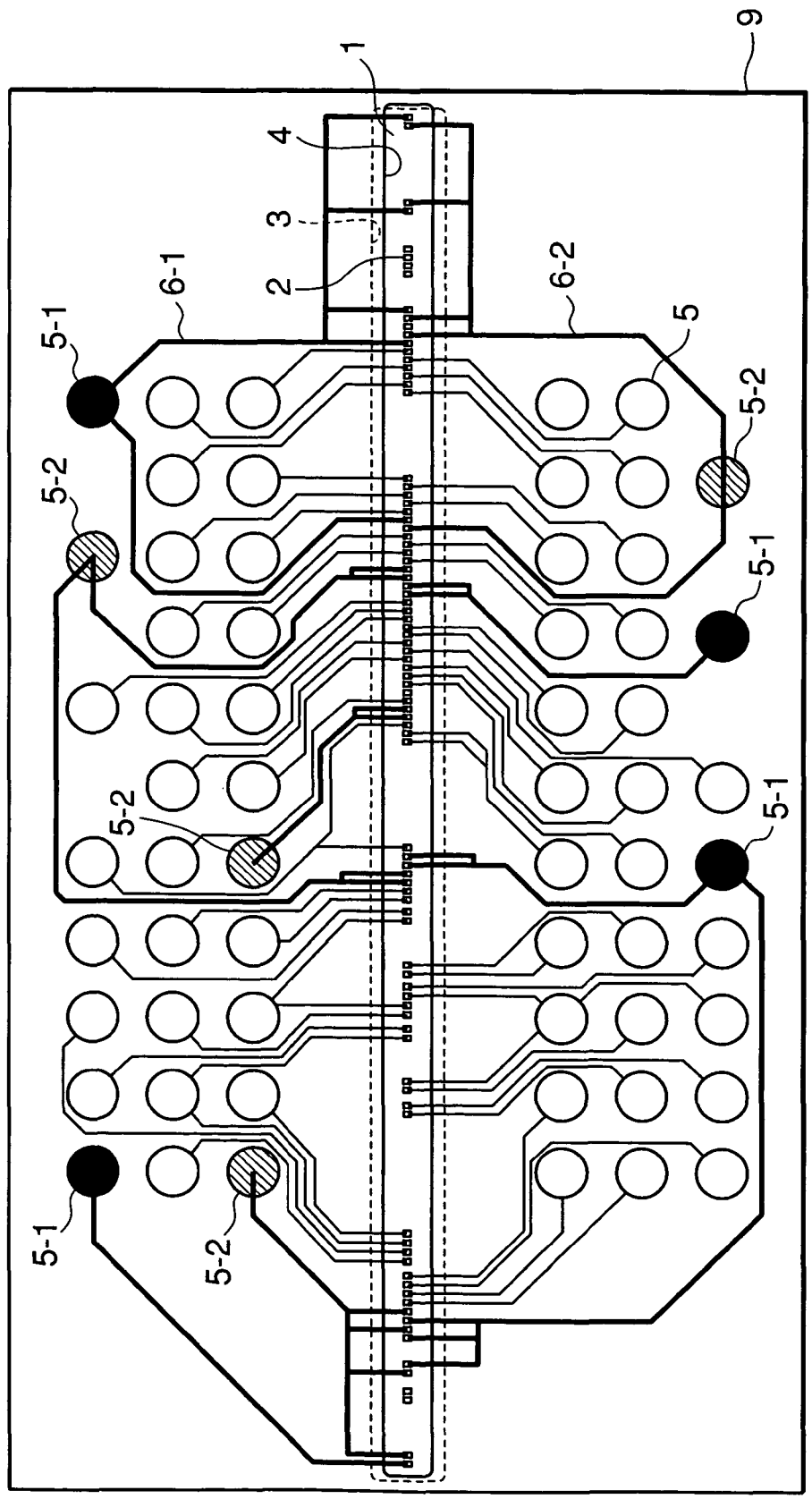
FIG. 1 is a power supply-to-GND connection diagram illustrating the connection between ball lands and pads that are arranged in a single row in a conventional semiconductor device.
Figure 2:
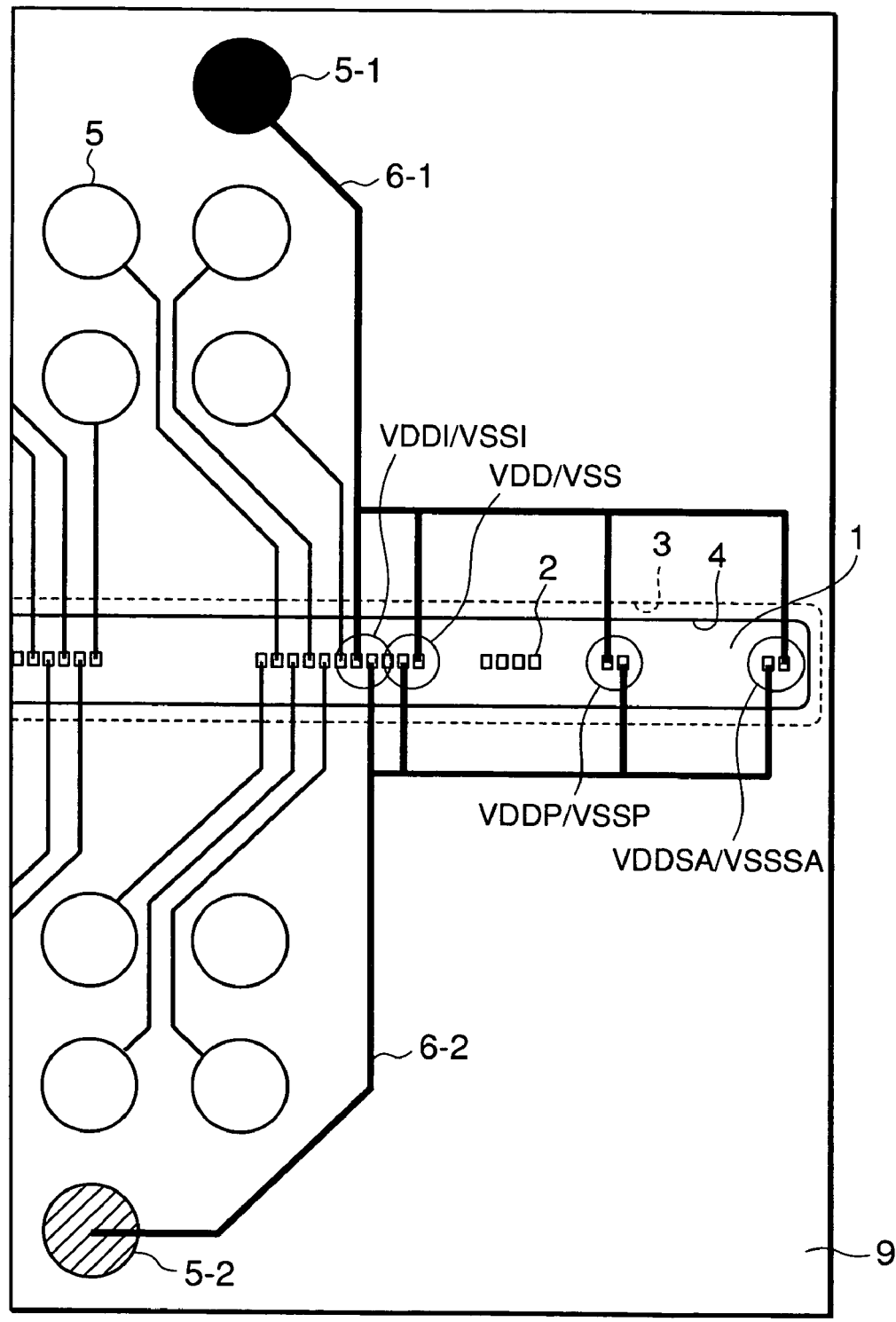
FIG. 2 is a power supply-to-GND connection diagram illustrating the connection between ball lands and pads in the area at the right end of FIG. 1.
Figure 3:
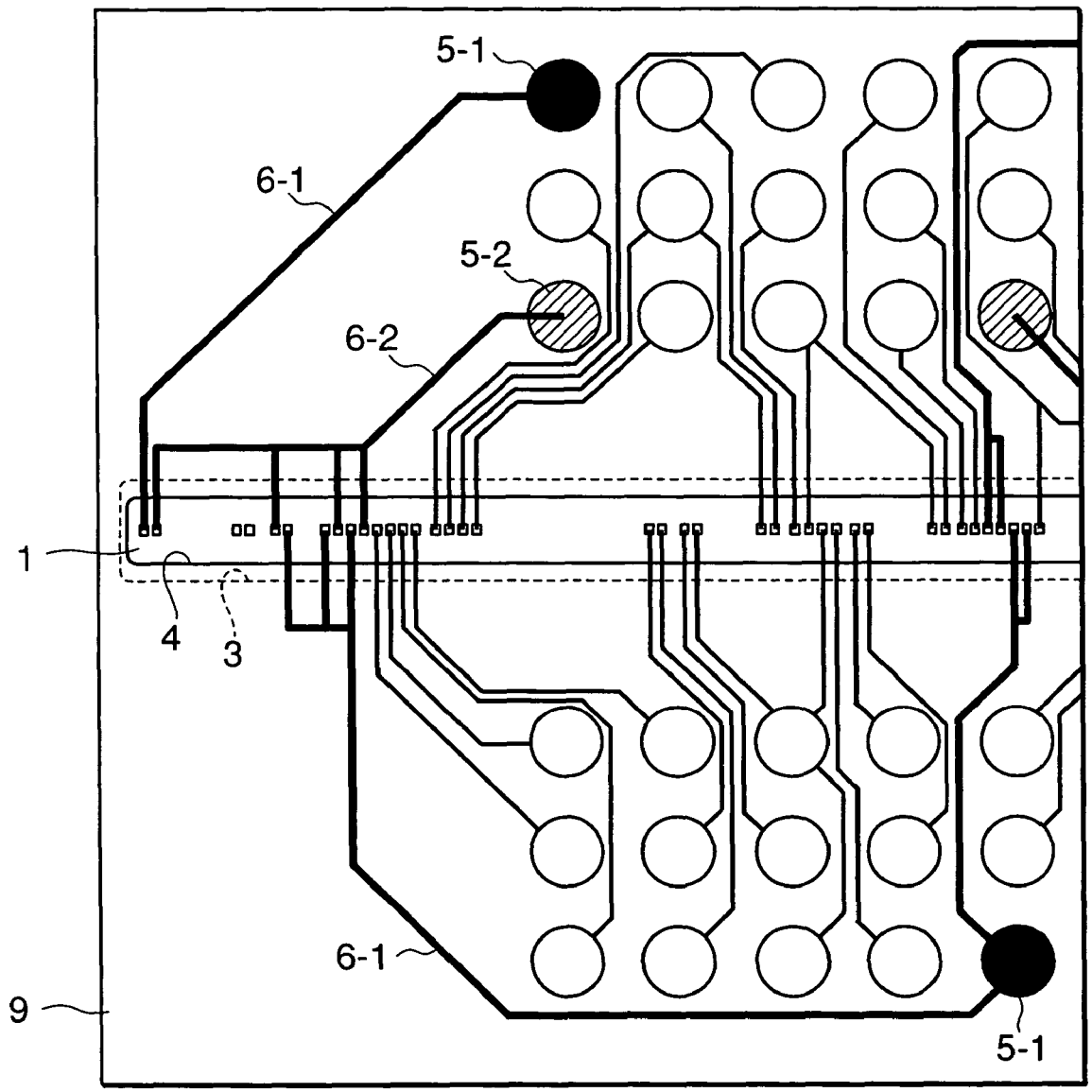
FIG. 3 is a power supply-to-GND connection diagram illustrating the connection between ball lands and pads in the area at the left end of FIG. 1.
Figure 4:
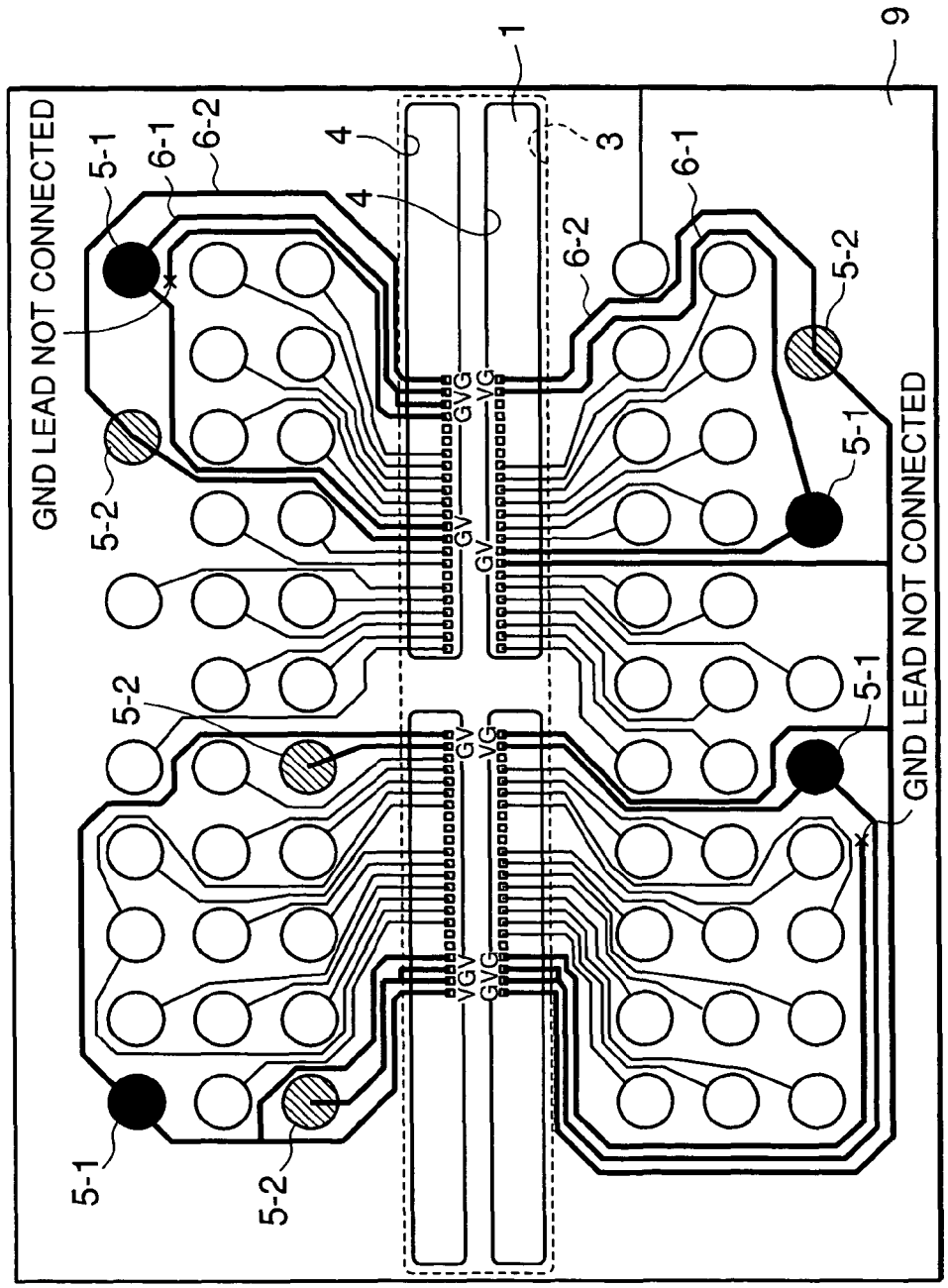
FIG. 4 is an example power supply-to-GND connection diagram illustrating the connection between ball lands and pads that are arranged in two rows.
Figure 5:
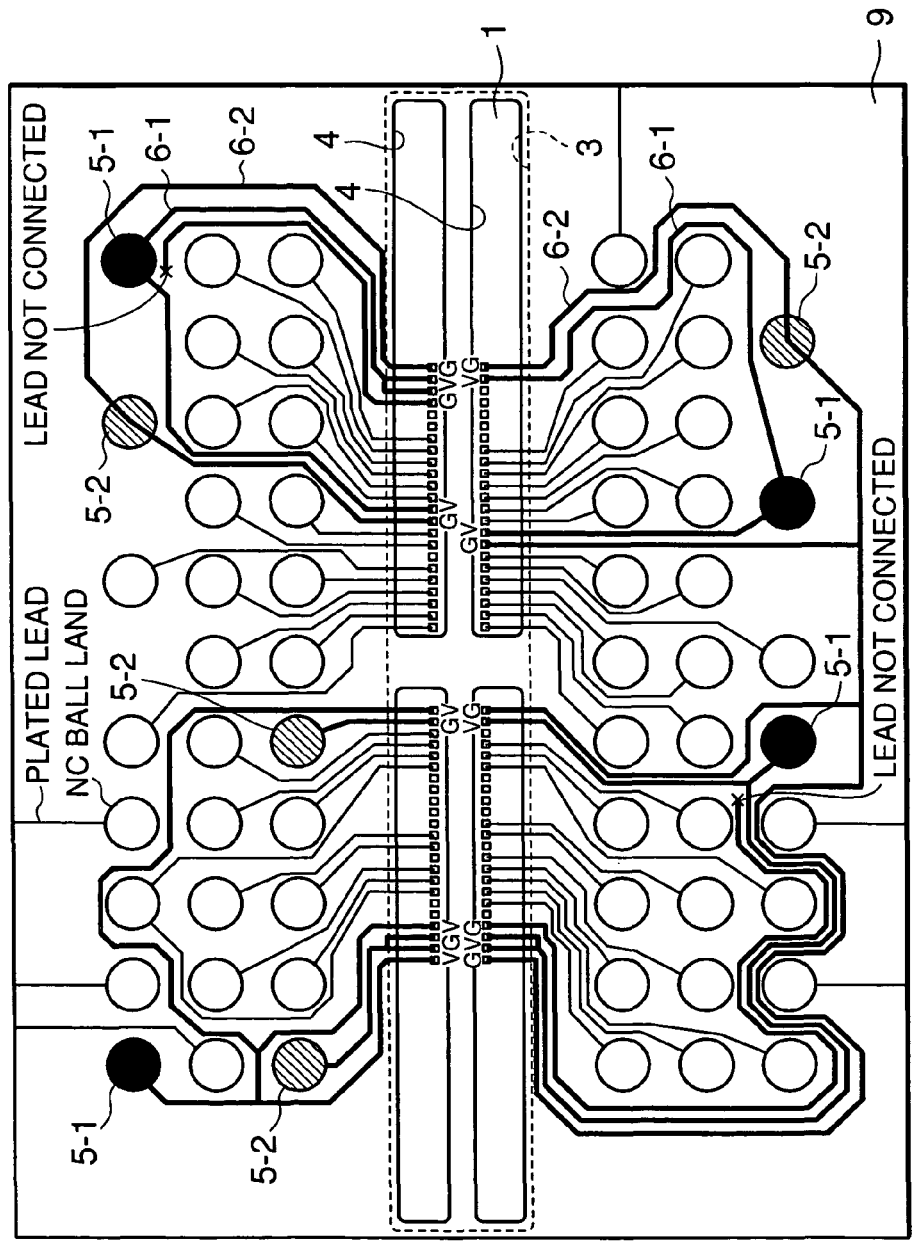
FIG. 5 is another example power supply-to-GND connection diagram illustrating the connection between ball lands and pads that are arranged in two rows.
Figure 6:
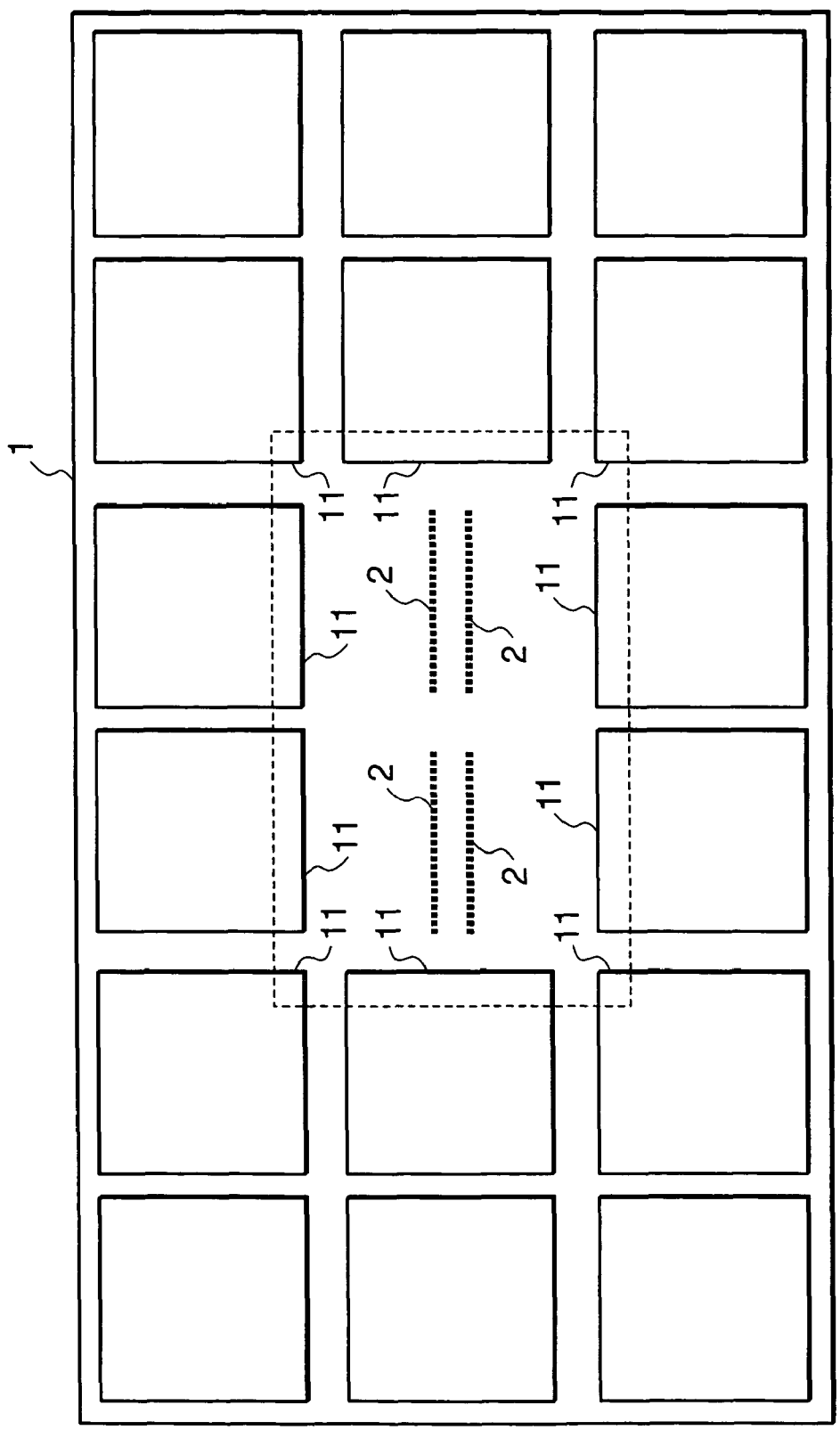
FIG. 6 is schematic view illustrating a semiconductor chip that has two rows of pads and that is included in a semiconductor device according to a first embodiment of the present invention.

The semiconductor device illustrated in FIGS. 8A and 8B is constructed, in a similar manner as that illustrated in FIG. 6, by stacking a package substrate 9 on a DRAM chip 1 with an elastomer interposed therebetween. The DRAM chip 1 and the package substrate 9 are bonded together with the elastomer. The package substrate 9 includes a TAB tape having a plurality of ball lands 5 and leads 6. Tape openings 4 corresponding to an elastomer opening 3 is formed in the TAB tape.

In the DRAM chip 1, a plurality of pads is arranged in two rows. The package substrate 9 has a TAB tape that includes a plurality of ball lands 5 and leads 6. The two tape openings 4 corresponding to the upper and lower pad rows are formed in the TAB tape. In the tape openings 4, TAB leads constituting the tips of the leads 6 are bonded to the pads. The package substrate 9 includes one wiring layer, and solder balls are provided as external pins at the ball lands.

As illustrated in FIGS. 8A and 8B, the upper row and the lower row of pads are referred to as row A and row B, respectively. VDD pads and VSS pads for the same type of power supplies are not disposed adjacent to each other in the same row but are disposed in row A and row B in a manner such that they are opposite to each other. A power supply ball land and a GND ball land in region C that are to be connected are a power supply ball land 5-1C disposed on the side of row A (i.e., upper area of the chip) and a GND ball land 5-2C disposed on the side of row B (i.e., lower area of the chip).

Three VDD pads are disposed in row A, and three VSS pads are disposed in row B. The three VDD pads in row A can be connected to the power supply ball land 5-1C via a power supply lead 6-1C. The three VSS pads in row B can be connected to the GND ball land 5-2C via a GND lead 6-2C.

In contrast to region C, in regions D and E, VSS pads are disposed in row A and VDD pads are disposed in row B. The VSS pads in row A can be connected to a GND ball land 5-2D via a GND lead 6-2D and to a ball land 5-2E via a GND lead 6-2E. The VDD pads in row B can be connected to a power supply ball land 5-1D via a power supply lead 6-1D and to a supply ball land 5-1E via a power supply lead 6-1E. Here, pads disposed closed to each other in the same region may be collectively referred to as a "pad group." In FIG. 8A, the power supply and the GND can be efficiently connected with a short lead since the ball lands of the package and the pads of the semiconductor chip are disposed on the same side.

As shown in FIG. 8B, in region F, a power supply ball land 5-1F and a GND ball land 5-2F are disposed in a wiring area on the side of row A. No power supply ball lands and GND ball lands are disposed in the wiring area on the side of row B. Therefore, it is desirable to dispose all VDD and VSS pads on the side of row A. However, in some cases, due to limitations on the area where pads can be disposed, the pads may have to be disposed in both rows A and B. In the illustrated case, VDD pads are disposed in row A and VSS pads are disposed in row B. Therefore, bridge sections 7 for connecting the GND ball land 5-2F on the upper side and the VSS pads on the lower sides are provided. The connection is established by providing the bridge sections 7 over sections of the tape openings 4 separating the wiring area of the package into two areas and by passing a lead over the bridge sections 7.

The VSS pads in row B on the lower side are connected to the GND ball land 5-2F in the upper wiring area via a GND lead 6-2F passed over the bridge sections 7. The VDD pads in row A on the upper side are connected to the power supply ball land 5-1F in the upper wiring area. In this way, by providing the bridge sections 7, pads on the lower side and a ball land on the upper side can be connected via a lead. The bridge sections 7 of the TAB tape can be constructed when forming the tape openings 4 by leaving sections of the TAB tape as the bridge sections 7.

In the semiconductor device illustrated in FIGS. 8A and 8B, a semiconductor chip 1 has two rows of pads. The VDD and VSS pad groups are disposed in the upper and lower rows so that their positions correspond to the ball lands as much as possible. The ball lands and pads disposed in the same area which is separated into upper and lower areas are directly connected if they are for the same type of power supplies or GNDs. However, if they are for different types of power supplies or GNDs, they are connected by using the bridge sections 7 provided over the tape openings 4. In this way, pads and ball lands disposed on different side can be connected via leads passed over the bridge sections 7. By connecting the pads and ball lands disposed on different sides with short leads, a semiconductor device that operates stably can be obtained.

Figure 9:
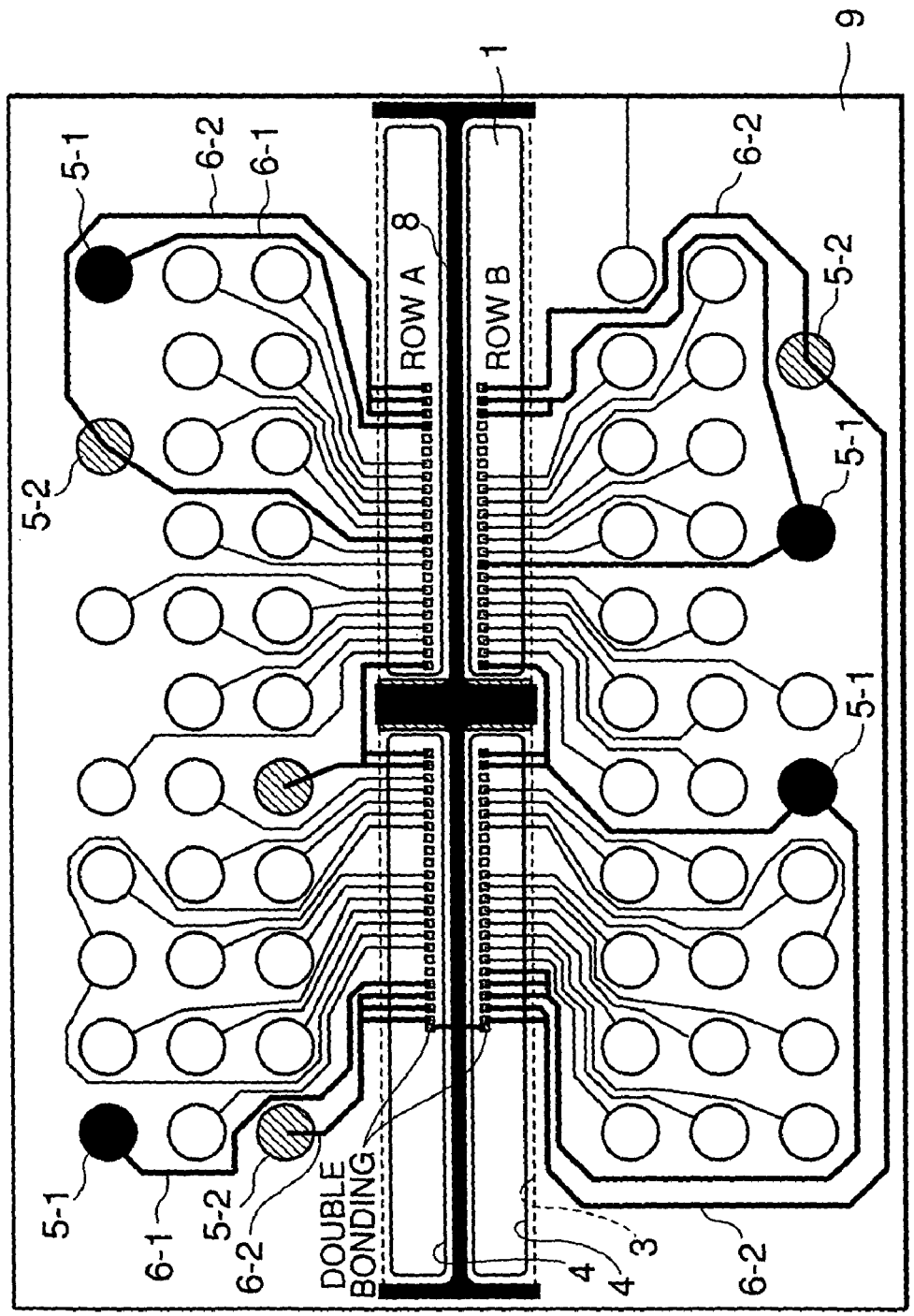
FIG. 9 is a power supply-to-GND connection diagram illustrating the connection between ball lands and pads in a semiconductor device according to a second embodiment of the present invention.

With reference to FIG. 9, the description will be made as regards a semiconductor device according to a second embodiment of the present invention. Components that are the same as those described above are represented by the same reference numerals, and descriptions thereof are not repeated.

The semiconductor device illustrated in FIG. 9 includes VDD pads and VSS pads in the upper pad row A and also includes VDD pads and VSS pads in the lower pad row B. In other words, both VDD pads and VSS pads are included in pad groups disposed at the end sections of the pad rows.

One GND ball land 5-2 is disposed at the lower side of the semiconductor device. Thus, the length of a GND lead 6-2 connecting VSS pads at the left end of the pad row to this GND ball land 5-2 is significantly long. Therefore, the VSS pads in row B are double-bonded so that they are also connected to another GND ball land 5-2 on the upper side. At the left end, by bonding the VSS pads in row B and a suspended pattern 8 and bonding the suspended pattern 8 and the VSS pads in row A, the upper and lower sides of the package substrate are connected. The suspended pattern 8 of the package substrate that is in a floating state is set as a VSS voltage, and the TAB leads of the suspended pattern 8 and the TAB leads of the GND leads 6-2 are double-bonded to the pads in the upper and lower rows. In other words, two TAB leads, i.e., a regular TAB lead and a TAB lead from the suspended pattern 8, are double-bonded to the each VSS pad at the left end of the row. To bond leads of two TAB tapes to one pad is referred to as "double-bonding."

In this way, by double-bonding the VSS pad at the end of row B and the VSS pad at the end of row A, the pads are connected to the GND ball land 5-2 disposed on the upper side via the suspended pattern 8 having a VSS voltage. In this way, pads can be connected to a GND ball land 5-2 that is disposed on the upper side and that is closer than the GND ball land 5-2 on lower side. Connections between the upper and lower areas separated by the tape openings 4 can be established. The power supply-to-GND connection between other pads and other ball lands is the same as that of the semiconductor device illustrated in FIGS. 8A and 8B. More specifically, VDD pads are connected to power supply ball lands 5-1 via power supply leads 6-1, and VSS pads are connected to GND ball lands 5-2 via GND leads 6-2.

In the semiconductor device illustrated in FIG. 9, the semiconductor chip includes two rows of pads. The VDD pads and the VSS pads are connected to power supply ball lands and GND ball lands, respectively. The suspended pattern of the package substrate in a floating state is set as a VSS voltage, and the TAB leads of the suspended pattern are connected to the VSS pads in the upper and lower rows. In this way, by double-bonding the VSS pads, the wiring area of the package separated into upper and lower areas by the tape openings 4 and elastomer opening 3 can be connected with short leads. As a result, a semiconductor device capable of stable operation is obtained.

With reference to FIG. 10A, the description will be made as regards a semiconductor device according to a third embodiment of the present invention.

Figure 10:
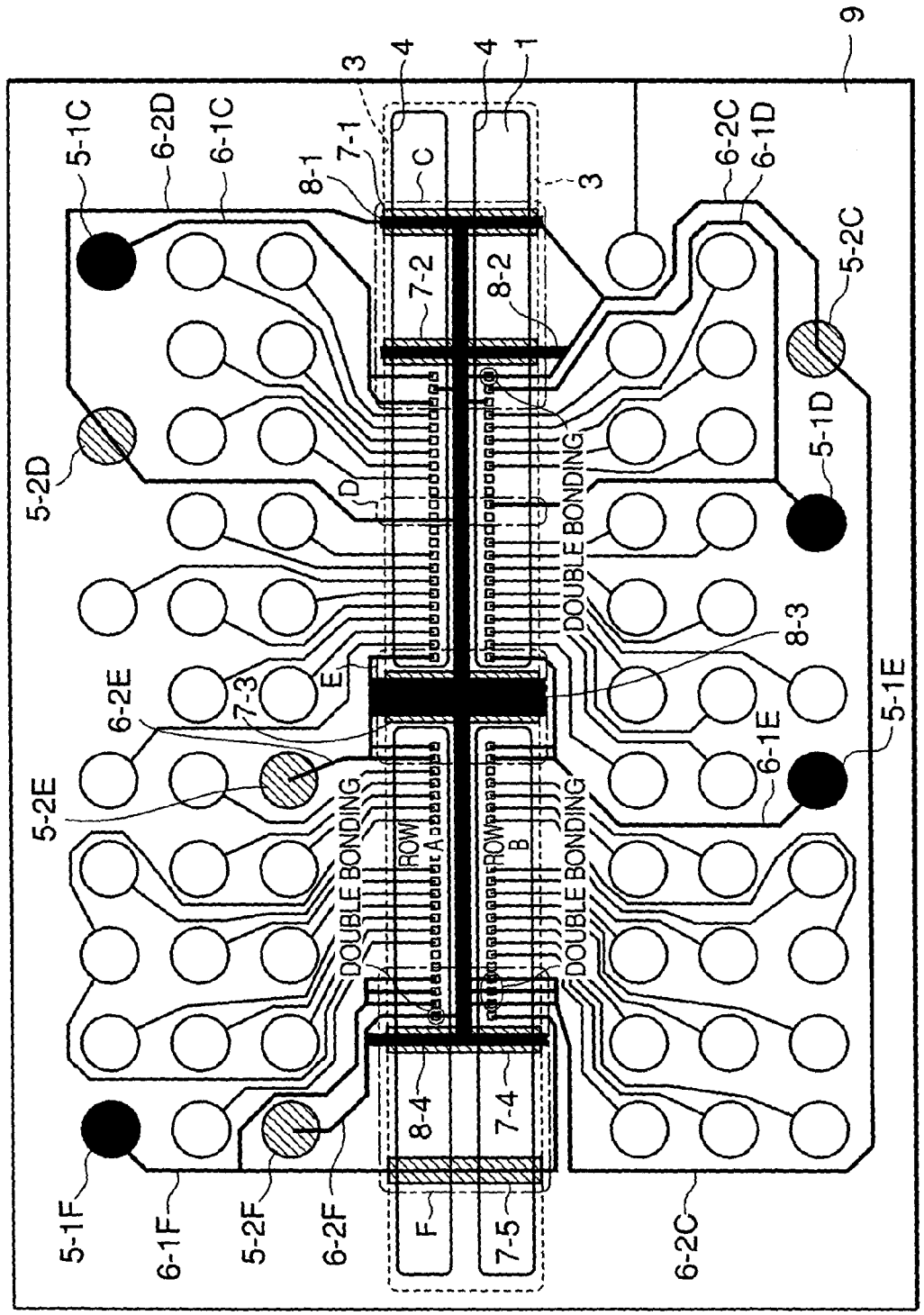
FIG. 10 is a power supply-to-GND connection diagram illustrating the connection between ball lands and pads in a semiconductor device according to a third embodiment of the present invention.

In the semiconductor device illustrated in FIG. 10, a direct connection of a suspended pattern and leads of a package substrate is established, in addition to a wiring connection by a bridge section such as that of the semiconductor device illustrated in FIGS. 8A and 8B and a double-bonding connection by a suspended pattern such as that of the semiconductor device illustrated in FIG. 9.

In the semiconductor device illustrated in FIG. 10, a horizontally extended suspended pattern 8 is directly connected to the upper and lower leads of the package substrate via suspended pattern sections 8-1, 8-2, 8-3, and 8-4 vertically extending from the suspended pattern 8. The connection is established by integrating the leads of the package substrate and the suspended pattern into a connected pattern. The vertically extended suspended pattern sections 8-1, 8-2, 8-3, and 8-4 are passed over bridge sections 7-1, 7-2, 7-3, and 7-4, respectively.

The upper row of the two rows of center pads is referred to as row A, whereas the lower row is referred to as row B. From the right end of row A of the semiconductor device, a VDD pad, a VSS pad, and a VDD pad are disposed in this order. From the right end of row B, a VSS pad, a VDD pad, and a VSS pad are disposed in this order. From the left end of row A, a VSS pad and three VDD pads are disposed in this order. From the left end of row B, a VDD pad and three VSS pads are disposed in this order. Other sections in the rows include VDD pads and VSS pads, as illustrated in drawing.

First, the power supply-to-GND connection between ball lands and the pads at the right ends of rows in the semiconductor device will be described. The suspended pattern sections 8-1 and 8-2 used for VSS connections are provided at the right end. The suspended pattern section 8-1 is directly connected to GND leads 6-2D and 6-2C of the package substrate and is connected GND ball lands 5-2C and 5-2D. The suspended pattern section 8-2 is also directly connected to the GND lead 6-2C of the package substrate and is connected to the GND ball land 5-2C. The suspended pattern section 8-2 is connected to the GND ball land 5-2D via the suspended pattern section 8-1.

VSS pads in rows A and B are bonded to TAB leads of the suspended pattern 8. These VSS pads are also bonded and connected to the GND lead 6-2C. In this way, the VSS pads at the right end are connected using the suspended pattern sections 8-1 and 8-2. The VDD pads at the right end are bonded to TAB leads of power supply leads 6-1C and 6-1D and are connected to power supply ball lands 5-1C and 5-1D.

A VSS pad in area D is double-bonded to the suspended pattern 8 and a TAB lead of the GND lead 6-2D. A VDD pad is bonded and connected to the power supply lead 6-1D. At the center (area E) of the semiconductor device, the suspended pattern section 8-3 is directly connected to VSS leads. VSS pads are double-bonded to the suspended pattern 8 and the TAB leads of a GND lead 6-2E. The VDD pads are double-bonded to the TAB leads of a power lead 6-1E and is connected to a power supply ball land 5-1E.

At the left end, a power supply lead 6-1F of a bridge section 7-5 and the suspended pattern section 8-4 are provided. VDD pads in row A are connected to a power supply ball land 5-1F via the power supply lead 6-1F. VSS pads in row A are double-bonded to the suspended pattern 8 and a GND lead 6-2F and are connected to a GND ball land 5-2F. The suspended pattern section 84 is connected to the GND lead 6-2F. VDD pads in row B are connected to the power supply ball land 5-1F via the lead 6-1F of the bridge section 7-5. The VSS pads are double-bonded to the suspended pattern 8 and the TAB leas of the GND lead 6-2C and are connected to a GND ball land 5-2C.

In the semiconductor device illustrated in FIG. 10, the pads and ball lands are connected by leads passed over the bridge sections provided across the tape openings and by double-bonding using TAB leads of the suspended pattern. The suspended pattern is joined with the wiring pattern of the package substrate and is directly connected. In this way, pads and ball lands disposed separately on the upper and lower sides can be connected. Accordingly, pads and ball lands can be connected by short leads for various different types of pad arrangements. By employing such connection patterns, the power supply-to-GND connection of pads of the chip and ball lands of the package can be established with short leads at low resistance. In this way, a semiconductor device that is capable of operating at high speed can be obtained.

In the semiconductor devices illustrated in FIGS. 8A to 10, pads and ball lands are connected by leads passed over bridge sections provided across tape openings or by double-bonding using TAB leads of the suspended pattern. The suspended pattern is joined with the wiring pattern of the package substrate and is directly connected. In this way, pads and ball lands disposed separately on the upper and lower sides can be connected by short leads. By employing short leads, voltage drop in the leads is reduced, and the operational margin is improved. For example, in a case in which the greatest reduction was achieved, the length of a package lead was reduced from 15.8 mm to 3.9 mm, which was a reduction by 75%.

What is claimed is:

1. A semiconductor device comprising:
   a semiconductor chip having at a center area thereof first and second pad rows which include a plurality of first pads and a plurality of second pads, respectively;
   a package substrate bonded to the semiconductor chip, the package substrate including a substrate opening corresponding to a region including the first and second pad rows, first and second wiring areas positioned at opposite sides of the substrate opening, respectively, a plurality of first ball lands disposed in the first wiring area, a plurality of second ball lands disposed in the second wiring area, a plurality of first leads disposed in the first wiring area, and a plurality of second leads disposed in the second wiring area, each of the first leads being connected to an associated one of the first pads of the semiconductor chip, each of the second leads being connected to an associated one of the second pads of the semiconductor chip, the first ball lands including plural ball lands each connected to an associated one of the first leads, and the second ball lands including plural ball lands each connected to an associated one of the second leads;
   a bridge section provided over the substrate opening; and
   at least one third lead, the at least one third lead being connected at one end thereof to at least one of the first leads connected to the first pads of the semiconductor chip, passing over the bridge section, and being connected at the other end thereof to at least one of the second ball lands.

2. The semiconductor device according to claim 1, further comprising an elastomer bonding the semiconductor chip and the package substrate to each other, the elastomer having an elastomer opening corresponding to a region including the first and second pad rows.

3. The semiconductor device according to claim 1, wherein:
   the package substrate includes a TAB tape; and
   the substrate opening is formed in the TAB tape.

4. The semiconductor device according to claim 1, wherein the bridge section is disposed at an end portion of the substrate opening such that the bridge section connects an end portion of the first wiring area and an end portion of the second wiring area neighboring the end portion of the first wiring area.

5. The semiconductor device according to claim 1, further comprising:
   a suspended pattern connected between a selected one of the first pads and a selected one of the second pads;
   a selected one of the first leads extending from the first wiring area and connected to the selected one of the first pads; and
   a selected one of the second leads extending from the second wiring area and connected to the selected one of the second pads.

6. The semiconductor device according to claim 5, wherein:

connection of the selected one of the first leads and the suspended pattern to the selected one of the first pads is carried out by double-bonding; and connection of the selected one of the second leads and the suspended pattern to the selected one of the second pads is carried out by double-bonding.

7. The semiconductor device according to claim 6, wherein the suspended pattern has a GND (VSS) voltage or a power supply (VDD) voltage.

8. The semiconductor device according to claim 1, further comprising an additional suspended pattern provided across the substrate opening and connected to the third lead.

9. The semiconductor device according to claim 8, wherein the additional suspended pattern has a GND (VSS) voltage or a power supply (VDD) voltage.

10. The semiconductor device as claimed in claim 1, wherein the at least one of the second ball lands has no electrical connection with any one of the second leads.

11. The semiconductor device as claimed in claim 1, wherein the at least one of the second ball lands is included in the plural ball lands each connected with the associated one of the second leads.

12. The semiconductor device as claimed in claim 1, wherein the bridge section includes a conductive layer thereon, the third lead including a first lead portion making an electrical path between the conductive later and one of the first pads of the semiconductor chip to which the at least one of the first leads is connected and a second lead portion making an electrical path between the conductive layer and one of the second pads of the semiconductor chip to which the at least one of the second ball lands is connected.

13. The semiconductor device as claimed in claim 3, wherein the bridge section comprises a portion of the TAB tape.

* * * * *

UNITED STATES PATENT AND TRADEMARK OFFICE
CERTIFICATE OF CORRECTION

| | |
|---|---|
| PATENT NO. | : 7,847,377 B2 |
| APPLICATION NO. | : 11/528688 |
| DATED | : December 7, 2010 |
| INVENTOR(S) | : Fumiyuki Osanai, Mitsuaki Katagiri and Satoshi Isa |

It is certified that error appears in the above-identified patent and that said Letters Patent is hereby corrected as shown below:

On the front cover of the Patent include the Assignee information:

(73)  Assignee:  Elpida Memory, Inc., Tokyo (JP)

Signed and Sealed this
Twenty-second Day of March, 2011

David J. Kappos
*Director of the United States Patent and Trademark Office*